United States Patent [19]

Tiwari

[11] Patent Number: 4,558,509

[45] Date of Patent: Dec. 17, 1985

[54] METHOD FOR FABRICATING A GALLIUM ARSENIDE SEMICONDUCTOR DEVICE

[75] Inventor: Sandip Tiwari, Ossining, N.Y.

[73] Assignee: International Business Machines Corporation, Armonk, N.Y.

[21] Appl. No.: 626,563

[22] Filed: Jun. 29, 1984

[51] Int. Cl.[4] .................... H01L 21/265; H01L 21/20
[52] U.S. Cl. .................................. 29/576 B; 29/571;
148/1.5; 148/175; 148/187; 357/23.2; 357/61;
357/91; 357/23.9
[58] Field of Search ............... 29/576 B, 571; 148/1.5,
148/187, 175; 357/91, 23, 61

[56] References Cited

U.S. PATENT DOCUMENTS

| | | | |
|---|---|---|---|
| 4,193,182 | 3/1980 | Lee | 29/571 |
| 4,265,934 | 5/1981 | Ladd, Jr. | 148/1.5 |
| 4,298,403 | 11/1981 | Davey et al. | 148/1.5 |
| 4,325,747 | 4/1982 | Ristow | 148/1.5 |
| 4,330,343 | 5/1982 | Christou et al. | 148/1.5 |
| 4,396,437 | 8/1983 | Kwok et al. | 148/1.5 |

OTHER PUBLICATIONS

Yokoyama et al., Appl. Phys. Letts. 42, (Feb. 1983), 270.
McLaughlin et al., Appl. Phys. Letts. 44, (Jan. 1984), 252.
Kuzuhara et al., J. Appl. Phys. 54, (1983), 3121.

Primary Examiner—Upendra Roy
Attorney, Agent, or Firm—Pollock, Vande Sande & Priddy

[57] ABSTRACT

A method for forming a FET in a gallium arsenide substrate whereby a gate is positioned on a [100] surface of the gallium arsenide substrate in the [011] orientation, active impurities are ion implanted to form FET source and drain regions which are self-aligned with respect to the gate, and the structure is annealed subsequent to the ion implanting whereby the active impurities are caused to diffuse laterally and thereby form channel region beneath the gate.

11 Claims, 6 Drawing Figures

METHOD FOR FABRICATING A GALLIUM ARSENIDE SEMICONDUCTOR DEVICE

DESCRIPTION

1. Technical Field

The present invention is concerned with a method for fabricating a semiconductor device of gallium arsenide. The present invention is particularly concerned with the fabrication of MESFET semiconductor devices from gallium arsenide whereby the source and drain regions are self-aligned with respect to the FET gate. The present invention is particularly concerned with a process whereby the precision of the gate channel length is significantly improved, the process simplified, and the characteristics improved.

2. Background Art

Gallium arsenide semiconductor materials have electro-optical and carrier transport properties useful in semiconductor devices. Gallium arsenide devices fabricated with ion-implantation technology are promising for high-speed logic devices and for microwave uses. It has been reported that self-aligned N+ source/drain ion-implantation technology can be used to significantly reduce parasitic-source series resistance and to improve the reproducibility of enhancement-mode GaAs metal-semiconductor field-effect transistors (MESFET's).

The technique of ion-implantation has the advantage of precision introduction of dopant species, but the technique also requires a subsequent annealing step at high temperatures which is necessary to reduce crystal damage and to activate the implanted impurities. However, the annealing causes some redistribution of the dopant and compensation changes in the channel region which are uncontrolled. This, in turn, causes concern with the proper or reliable operation of the device because of the uncontrolled diffusion. This problem is particularly of concern with respect to large-scale integration of circuits.

SUMMARY OF THE INVENTION

The present invention makes it possible to form precise gate channel lengths. In addition, the present invention overcomes the problem of dopant redistribution and compensation changes previously observed in prior reported self-aligned processes for gallium arsenide semiconductor devices. The present invention provides for a simplified process for achieving a reliable and controlled channel and for eliminating uncontrolled diffusion and redistribution of dopants.

In particular, the present invention is concerned with a method for fabricating a semiconductor device. The method of the present invention includes providing a gallium arsenide substrate and providing gate regions on the substrate whereby the gate regions are positioned on a (100) surface of the gallium arsenide substrate. Active impurities are ion-implanted into predetermined regions of the gallium arsenide substrate to provide FET source and drain regions which are self-aligned with respect to the gate and are distributed underneath the gate at the gate edge due to implantation knock-on effects.

The substrate can be one which has been doped or can be a semi-insulating substrate. However, a semi-insulating substrate will not have the advantage of threshold control through substrate bias as achieved by a doped substrate. In the event a doped substrate is used, it will be doped with active impurities of a first type and the doping for the FET source and drain regions will be of a second and different type as compared to the first type.

Subsequent to the ion implanting, the structure is annealed. The annealing temperature is greater than the ion-implantation temperature and the annealing causes the active impurities for the FET source and drain regions to diffuse laterally and thereby form channel region beneath the gate. An insulating layer is provided and contact holes are delineated to the gate and to source and drain regions. Metallic-type high conductivity electrical interconnection pattern is deposited and delineated to provide electrical connection to the gate and to source and drain regions.

BEST AND VARIOUS MODES FOR CARRYING OUT THE INVENTION

The particular semiconductor devices which are fabricated according to the present invention are MESFET devices. The substrate of the devices of the present invention is a semi-insulating gallium arsenide or preferably a gallium arsenide of a first conductive type containing active doping impurities of the first type.

In discussing the semiconductor fabrication method, the usual terminology that is well-known in the transistor field will be used herein.

Unless otherwise specified, when reference is made to an impurity of a "first type" and to an impurity of a "second type", it is understood that the "first type" refers to an N-type or P-type material. "Second type" refers to the other material. That is, if the "first type" is P, then the "second type" is N. If the "first type" is N, then the "second type" is P. In referring to a region containing an impurity concentration of a P-type, for instance, it is meant the "significant impurity" is a P-type and that the majority carriers are holes.

For convenience, the discussion of the fabrication steps is directed to the preferred aspects of employing a semi-insulating substrate or preferably, a P-type gallium arsenide substrate as the semiconductor substrate and N-type impurities. This leads to the N-channel FET technology. Accordingly, it is understood that an N-type substrate or semi-insulating substrate and P-type ion implanted dopant impurities can be employed according to the present invention in the P-channel FET technology. The purpose of employing a substrate containing active impurities of the type opposite from those for the source and drain is to allow for threshold control by using a substrate bias.

It is understood that when the discussion refers to N-type impurities, the process steps are applicable to P-type impurities and vice-versa. Also, as used herein, the terms "metallic type interconnection lines" or "high conductivity interconnection lines" refer to metal lines such as titanium-platinum-gold metallurgy, as well as intermetallic silicides which have conductivities of the magnitude generally possessed by conductive metals.

Also, for convenience, the discussion of the fabrication steps refer to photolithography. However, other lithographic techniques such as electron-beam systems can be employed when desired. Moreover, although the discussion which follows refers to dry etching, it is understood that other etching techniques such as wet chemical etching can be used when desired.

Figure 1:
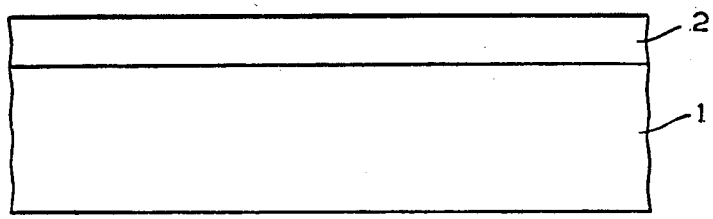
FIGS. 1–6 are cross-sectional views of a MESFET device in various stages of fabrication in accordance with the process of the process of the present invention.

Referring to FIG. 1, there is shown a P-type gallium arsenide substrate 1 having a crystal orientation (100) by methods well-known in the art for providing a semiconductor substrate such as the Czochralski or Bridgeman methods. The substrate 1 preferably has a resistivity of about $10^{10}$ to about 20 ohms-centimeter. Exemplary of some P-type impurities include zinc, cadmium, magnesium, manganese, and beryllium. The specific thickness of the substrate is not particularly crucial to the present invention and can vary widely depending upon the final use of the semiconductor device and is primarily determined by economical and practical considerations. For convenience, the substrate can be from about 10 to about 50 mils thick. It is also contemplated that a layer of the above resistivity can be grown on a heavily P doped substrate.

A layer 2 of highly conductive material for the gate is deposited on the substrate. This layer is approximately 1,500 to about 5,000 angstroms thick and may be formed by chemical-vapor deposition, sputtering, or co-evaporation. The layer 2 must be capable of withstanding the annealing and subsequent diffusion conditions without losing its rectifying properties. Examples of suitable materials include tungsten; various metal silicides such as such as tungsten silicide, titanium silicide, tantalum silicide, hafnium silicide, and rhodium silicide; and metal nitrides such as titanium nitride and tungsten nitride. If desired, mixtures of the above materials can be employed.

Figure 2:
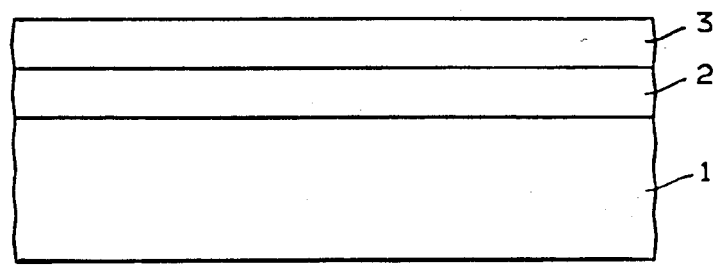

A gate pattern determining layer such as a layer of positive resist material 3 of the type employed in known lithographic masking and etching techniques is placed over the surface of the metallic type gate material. Any of the well-known photosensitive resist materials known in the art may be used. The resist material is applied such as by spinning on or by spraying. The resulting structure is shown in FIG. 2.

The layer of photoresist material is selectively exposed to radiation through a photolithographic mask. This mask is of a transparent material having opaque portions in a predetermined pattern. The mask wafer is subjected to radiation causing photochemical reactions which change the molecular structure and solubilities of the resist material underlying the transparent regions of the mask. After removing the mask, the wafer is rinsed in a suitable developing solution which washes away the portions of the resist material which were under the transparent portions of the mask and thus, exposed to the radiation. The assembly can then be baked to further and harden the remaining resist material which conforms to the desired pattern (i.e., it covers the regions in which the gate regions will subsequently be formed). Next, the structure is treated to remove the portions of the metallic-type layer 2 not protected by the resist material. Patterns in the metallic-type layer 2 can be formed by reactive ion etching in plasmas formed by fluorine containing gases such as $CF_4$.

The photoresist material 3 remaining on top of the formed gate layer is now removed by dissolving in an organic solvent such as acetone. Accordingly, the gates are formed on the substrate (See FIG. 3).

It is critical to the process of the present invention that the substrate be orientated such that the gates are formed on a [100] surface of the substrate in the [011] orientation. It has been found that by providing this specific orientation, a channel region can be provided of precise channel length beneath the gate during subsequent annealing of the structure. It has been found that the [011] orientation provides for enhanced lateral diffusion of impurities during the subsequent annealing which is sufficient to form a channel region of the desired dimension and dopant distribution.

The length of the gate is usually about 1.5 microns or less and can be as little as about 0.2 microns. The preferred gate lengths, in accordance with the present invention, are about 0.5 to about 1 micron.

Figure 3:
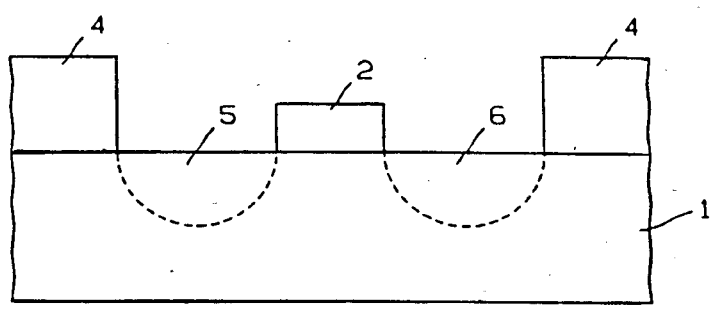

Next, the N-type source 5 and drain 6 regions are formed by well-known ion implantation technique (See FIG. 3). The layer 4 is a photoresist pattern formed by exposure and development to allow for delineation of the edges of the N-type dope. The layer 4 is removed after the ion implantation. The already present gate also acts as a mask during the implantation and provides for self-aligned source and drain regions. Examples of suitable N-type dopant impurities include silicon, sulphur, selenium, and telurium. The preferred N-type dopant used in accordance with the present invention is sulphur. The implantation energy is typically about 30 KeV to about 200 KeV (kiloelectron volts) with a dosage of about $1.5 \times 10^{12}$ to about $5 \times 10^{14}$ impurity atom per $cm^2$.

Next, the structure is subjected to an annealing in order to repair any crystal damage and to activate the implanted impurities. The annealing is generally carried out at about 750° C. to about 1100° C. for about 2 seconds to about 180 minutes. It is necessary that during the annealing the substrate be capped or covered in order to prevent localized loss of the more volatile arsenic of the gallium arsenide semiconductor material. Various methods have been suggested for providing a capping or covering layer to prevent or at least minimize the decomposition of the gallium arsenide. Such methods include providing a silicon nitride or aluminum nitride capping layer, a silicon dioxide capping layer, or providing an arsenic overpressure. Suitable means for providing a desired arsenic overpressure include providing a capping layer of gallium arsenide, or indium arsenide, a layer of solid arsenic, or an environment of arsene gas.

Examples of suitable techniques are suggested in U.S. Pat. No. 4,226,667; U.S. Pat. No. 3,969,164; U.S. Pat. No. 4,135,952; U.S. Pat. No. 4,312,681; Kuzuhara, Infrared Rapid Thermalannealing of Si-implanted GaAs, "Appl. Phys. Lett. 41 (8), Oct. 15, 1982, pages 755–758; Kasahara, et al., "Capless Anneal of Ion-Implanted GaAs in Controlled Arsenic Vapor", J. Appl. Phys. 50 (1), Jan. 1979, pages 541–543; Lidow, et al., "A Double-Layered Encapsulante for Annealing Ion-Implanted GaAs up to 1100° C.", Applied Physics Letters, Vol. 31, No. 3, Aug. 1, 1977, pages 158–161; Immorlica, et al., "Capless Annealing of Ion-Implanted GaAs", Applied Physics Letters, Vol. 29, No. 2, July 15, 1976, pages 94–95; Nishi, et al., "AlN Encapsulant for Fabrication of Implanted GaAs ICs", Inst. Phys. Conf. Cer. No. 63, Chapter 8, paper presented at the Int. Symp. GaAs and Related Compounds, Japan, 1981, pages 365–370; and Woodall, et al., "Proximate Capless Annealing of GaAs Using a Controlled-Access Vapor Pressure Source", Appl. Phys. Lett. 38 (8), Apr. 15, 1981, pages 639–641. Disclosures of the above materials are incorporated herein by reference. Since the various capping techniques employed are well-known, a detailed discussion of the matter of capping during the annealing need not be described herein in any great detail.

The preferred annealing techniques employed are ones which employ lower temperatures and lower times. This provides for better control of the diffusion.

A preferred annealing technique is the rapid thermal annealing for 2 to 6 seconds at temperatures above 750° C. Sulphur is found to anneal with best control at about 800° C. with the temperature measured using a thermocouple. Other impurities such as silicon require higher temperature of about 1000° C. for similar lengths of time.

Figure 4:
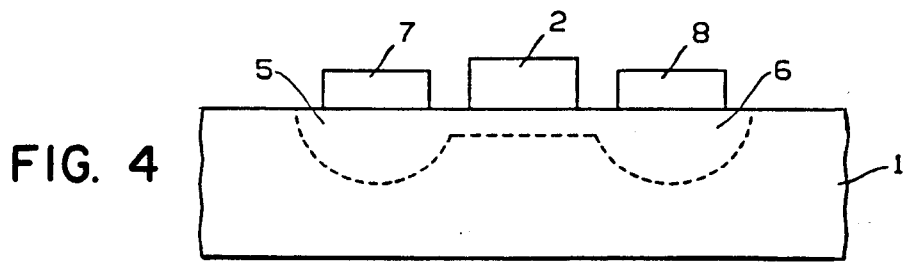

Next, the regions 5 and 6 are contacted with an ohmic metallization using metal lift-off techniques with photoresist. Example of an ohmic contact is a Au Ge-Ni-Au metallurgical sequence which is subsequently alloyed at about 400°-500° C. Another example is molybdenum germanide sintered between 650° C. and 850° C. In FIG. 4, numeral 7 and numeral 8 refer to the source and drain ohmic contacts, respectively.

By providing the gate on a [100] surface and [011] orientation of the substrate the annealing causes the impurities to diffuse beneath the gate region, thereby forming the desired FET channel region (See FIG. 4). The particular sequence of steps employed in accordance with the present invention overcomes the problem of dopant redistribution and compensation changes usually observed in the self-aligned processes whereby a channel has already been formed prior to the gate formation and implantation of the low resistant contact regions. An example of such a prior procedure is described by Yokoyama, "Orientation Effect of Self-Aligned Source/Drain Planar GaAs Schottky Barrier Field Effect Transistors", Appl. Phys. Lett., Vol. 42, No. 3, Feb. 1, 1983, pages 270-271.

Once persons skilled in the art are aware of the present application, the parameters of the annealing (temperature and time) can be readily determined without undue experimentation to provide the desired channel dependent upon the length of the channel, the amount of implantation, and the annealing temperature.

Although rapid annealing is the preferred annealing procedure, isothermal annealing can be used when desired. Isothermal annealing requires longer times than rapid annealing. For example, sulphur at 700° C. is annealed for 30 minutes and silicon is annealed at 850° C. for 30 minutes.

Figure 5:
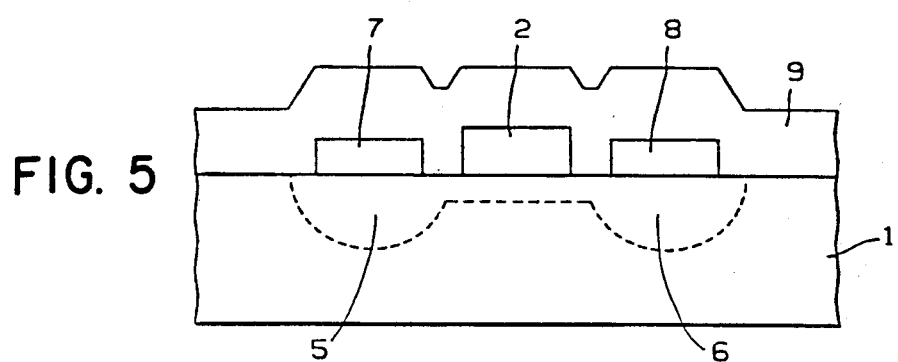

Next, a dielectric insulation layer 9 is formed above the gate and above the N-type source and drain regions, respectively, not covered by the gates. Layer 9 electrically insulates the subsequently formed conductive line to the gate from the N-type source and drain regions. Layer 9 also decreases the capacitive coupling between the metallic interconnection line and the source, drain, and substrate (See FIG. 5).

The dielectric insulation over the gate and the N-type source and drain region can be formed by plasma enhanced CVD deposition of silicon dioxide or silicon nitride layers.

In fabricating FET integrated circuits, it is necessary to connect conductive lines to the gate and to the N-type source and drain regions. This is done by applying a photoresist layer to the assembly. The resist material is exposed with U.V. radiation using a predetermined lithographic mask pattern and the exposed portions of the resist are dissolved away.

Next, the substrate is treated to remove the portions of the silicon dioxide or silicon nitride not protected by the resist material. The layer is etched by reactive ion etching in a fluorinated plasma to provide contact holes or vias through the insulation layer to allow electrical connection to the gate and to the N-type source and drain regions. The remaining photoresist above the etched silicon dioxide or silicon nitride is then removed by dissolving in a suitable solvent. Now the gate and the N-type source and drain regions in the contact holes have been revealed for contacting.

Figure 6:
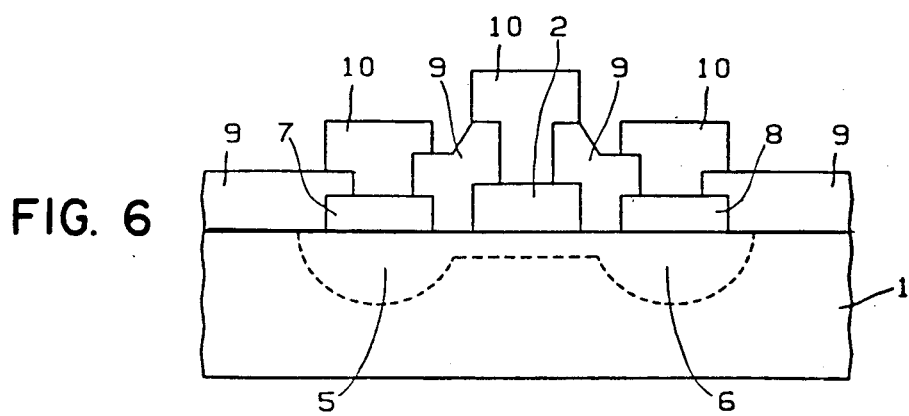

Next, the metallic-type highly conductive-interconnection line material 10, preferably a metal, is deposited and the interconnection pattern is delineated (See FIG. 6). An example of a highly-conductive material commonly used for interconnections is titanium-platinum-gold metallurgy. The highly-conductive material may be deposited by sputtering or preferably by evaporation. The thickness of the metal contact layer is generally from about 0.1 to about 5 microns and preferably from about 0.5 to about 1 micron.

The temperatures of the deposition of the metal contact and sintering of deposited metal should not be so high as to cause diffusion of the already formed doped regions including the channel and should not increase the temperature of the substrate above about 100° C. Temperatures from about 25° C. to about 60° C. are generally employed for depositing the metal.

Other sequences than those discussed hereinabove can be used to provide semiconductor devices in accordance with the present invention. For example, the dielectric insulation can be deposited before source and drain contacts are formed. The via-holes are opened in the insulation for the source-drain contacts deposition. In addition, the dielectric deposition can be made prior to ion implantation. Of course, many other possible sequences exist and are contemplated within the scope of the present invention.

What is claimed is:

1. A method for fabricating a semiconductor device which comprises:
   A. providing a gallium arsenide substrate;
   B. providing gate regions positioned on a (100) surface of the substrate in the [011] orientation;
   C. ion implanting active impurities into predetermined regions of the gallium arsenide substrate to provide FET source and drain regions which are self-aligned with respect to said gate;
   D. annealing subsequent to ion implanting whereby the annealing temperature is greater than the ion implantation temperature whereby said active impurities are caused to diffuse laterally and thereby form channel region beneath said gate;
   E. delineating contact holes to said gate and to source and drain regions; and
   F. depositing and delineating metallic-type high conductively electrical interconnection pattern that makes electrical connection to the gate and to source and drain.

2. The method of claim 1 wherein said active impurities are N-type impurities.

3. The method of claim 1 wherein the length of the gate is about 1.5 microns or less.

4. The method of claim 1 wherein the gate length is about 0.5 microns to about 1 micron.

5. The method of claim 1 wherein the annealing is carried out at a temperature of about 750° C. to about 1100° C. for about 2 seconds to about 180 minutes.

6. The method of claim 1 wherein said substrate is a semi-insulating substrate.

7. The method of claim 1 wherein said substrate is a gallium arsenide substrate containing active impurities of a type different from the active impurities for said source and drain regions.

8. The method of claim 2 wherein said N-type impurities are selected from the group of sulphur, silicon, selinium, and telurium.

9. The method of claim 2 wherein said N-type impurities are sulphur.

10. The method of claim 3 wherein the gate length is about 0.2 microns to about 1.5 microns.

11. The method of claim 9 wherein the N-type impurities are ion implanted employing energy of about 30 KeV to about 200 KeV at a dose of about $1.5 \times 10^{12}$ to about $5 \times 10^{14}$ per $cm^2$.

* * * * *